(12) United States Patent
Banik

(10) Patent No.: US 6,930,509 B2
(45) Date of Patent: Aug. 16, 2005

(54) PROGRAMMABLE INPUT/OUTPUT BLOCK

(75) Inventor: Saikat-Kumar Banik, Buckinghamshire (GB)

(73) Assignee: STMicroelectronics Limited (GB)

( * ) Notice: Subject to any disclaimer, the term of this patent is extended or adjusted under 35 U.S.C. 154(b) by 0 days.

(21) Appl. No.: 10/675,200

(22) Filed: Sep. 29, 2003

(65) Prior Publication Data
US 2005/0024114 A1 Feb. 3, 2005

(30) Foreign Application Priority Data
Sep. 30, 2002 (EP) .......................................... 02256804

(51) Int. Cl.$^7$ .......................................... H03K 19/173
(52) U.S. Cl. .............................. 326/38; 326/46; 326/93
(58) Field of Search .............................. 326/37–41, 46, 326/93–88

(56) References Cited

U.S. PATENT DOCUMENTS

| | | | |
|---|---|---|---|
| 5,594,367 A | | 1/1997 | Trimberger et al. |
| 5,844,844 A | | 12/1998 | Bauer et al. |
| 6,211,695 B1 | * | 4/2001 | Agrawal et al. ............. 326/40 |
| 6,285,211 B1 | | 9/2001 | Sample et al. |
| 6,331,790 B1 | * | 12/2001 | Or-Bach et al. ............. 326/41 |
| 6,417,693 B1 | * | 7/2002 | Skahill et al. ............... 326/41 |
| 6,777,980 B2 | * | 8/2004 | Young et al. ................ 326/41 |

FOREIGN PATENT DOCUMENTS

WO   WO 02/056515   7/2002

OTHER PUBLICATIONS

European Search Report, EP 02 25 6804, dated Mar. 21, 2003.

* cited by examiner

*Primary Examiner*—Don Le
(74) *Attorney, Agent, or Firm*—Jenkens & Gilchrist, PC

(57) ABSTRACT

A programmable flip-flop is presented for outputting data. The flip-flop includes a first latch for latching a first input value in response to a rising edge of a clock signal. A second latch latches a second input value in response to a falling edge of the clock signal. A selection function controlled by the clock signal selectively supplies outputs of the first and second latches to the input of a third latch. A control circuit for the third latch accepts as inputs the clock signal and an inverted clock signal. The programmable flip-flop is configurable to operate in at least first and second modes selectable by the selection function and third latch control circuit, such that in the first mode the output of the third latch is the first and second input values multiplexed together and output at twice the clock rate. Alternatively, in the second mode one of the first and second latches is disconnected from the third latch such that the programmable flip-flop operates as a single edge-triggered register clocking out one of the first and second input values from the third latch.

27 Claims, 5 Drawing Sheets

PROGRAMMABLE INPUT/OUTPUT BLOCK

PRIORITY CLAIM

The present application claims priority from European Application for Patent No. 02256804.2, filed Sep. 30, 2002, the disclosure of which is hereby incorporated by reference.

BACKGROUND OF THE INVENTION

1. Technical Field of the Invention

The present invention relates to field programmable gate arrays (FPGAs), and, more particularly, to an interface block for use with such circuitry.

2. Description of Related Art

Referring to FIG. 1, there is shown a prior art bidirectional I/O device 100 that, takes an output OUT (not-OUT) and provides it to an output PAD 101. OUT and not-OUT are provided as inputs to a multiplexer 102, the output S01 of which is selected by the contents of memory elements 103 and 104. Similarly, OUT and not-OUT are provided as inputs to a multiplexer 105, the output of which is selected by the contents of memory elements 106 and 107 and provided to the input of a D-type register 108. The output of the D-type register 108 is fed in inverted and non-inverted form to the input of a multiplexer 109, the output S02 of which is selected by the contents of memory elements 110 and 111. An output buffer 112 selects one input at a time from S01 and S02 and provides the output to the pad 101.

At each positive edge of the clock (feeding the register 108), the presently selected data OUT signal from the core is made available at the PAD. The data rate of the PAD is therefore limited to the clock frequency. To avoid conflicts at the output, only one of memory elements 103, 104, 110 and 111 is held high at any given time.

When operating as an input, an input buffer 113 takes input from the PAD and delivers it to the core (IN). In this mode, the output buffer 112 operates in tristate mode (selected by signal TS), thereby presenting a high impedance to the PAD.

Power consumption within CMOS circuitry is proportional to the frequency of clock signals used within the circuitry. As the clock frequency increases, the die temperature also increases, which requires a correspondingly increasing amount of heat to be dissipated. As the devices have increased in speed, the limiting factor on clock frequency has become the amount of heat a given package can dissipate. Dual data rate (DDR) techniques have been used to enable a halving in clock rates for a given clock frequency. However, these tend to require a relatively high number of registers and in-line multiplexers, which adds undesirable complexity and consumes an undesirable amount of on-chip real-estate.

SUMMARY OF THE INVENTION

According to one aspect of the present invention there is provided a programmable flip-flop for outputting data, the flip-flop including a first latch for latching a first input value in response to a rising edge of a clock signal, a second latch for latching a second input value in response to a falling edge of the clock signal, selection means controlled by the clock signal for selectively supplying outputs of the first and second latches to the input of a third latch, third latch control means accepting as inputs the clock signal and an inverted clock signal, the programmable flip-flop being configurable to operate in at least first and second modes selectable by the selection means and third latch control means, such that in the first mode the output of the third latch is the first and second input values multiplexed together and output at twice the clock rate, and in the second mode one of the first and second latches is disconnected from the third latch such that the programmable flip-flop operates as a single edge-triggered register clocking out one of the first and second input values from the third latch.

Another aspect of the invention provides an input/output block which includes such a programmable flip-flop and which further includes first input selection means and second input selection means being selectable such that a first data value supplied to the first input selection means can be output as the first input value or the second input value, and a second data value supplied to the second input selection means can be output as the first input value of the second input value.

A still further aspect of the invention provides a field programmable gate array incorporating an input output block as hereinabove defined.

It will be clear therefore that, when the flip-flop works on both edges of the clock (as a dual edge flip-flop), the FPGA input/output block works at a clock frequency which is twice the normal clock frequency. Thus, the FPGA input/output block can operate at a relatively higher frequency such that power dissipation is better controlled.

BRIEF DESCRIPTION OF THE DRAWINGS

A more complete understanding of the method and apparatus of the present invention may be acquired by reference to the following Detailed Description when taken in conjunction with the accompanying Drawings wherein.

DETAILED DESCRIPTION OF THE DRAWINGS

Figure 3:
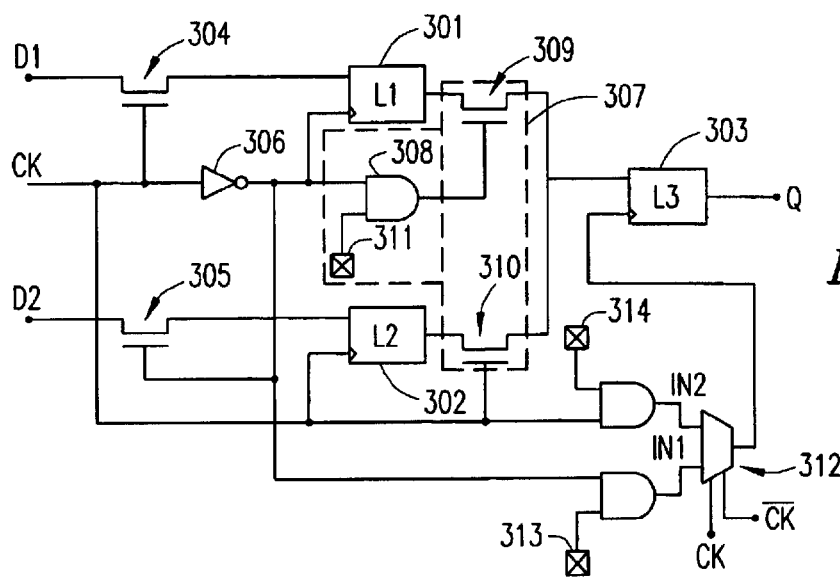
FIG. 3 shows a schematic of programmable memory block for use in any of the I/O blocks shown in FIGS. 2 to 2B.
Figure 4:
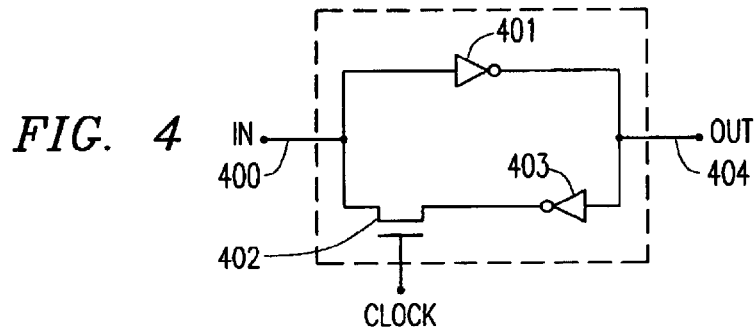
FIG. 4 shows an exemplary latch for use in the memory block of FIG. 3.

Referring to FIG. 3, a memory block 300 for use in a field programmable gate array (FPGA) integrated circuit includes a first latch 301, a second latch 302 and a third latch 303, each of the latches being rising-edge triggered. As shown in FIG. 4, each latch includes an input node 400, which is connected to the input of a first inverter 401 and to one side of a switch in the form of a field effect transistor (FET) 402. The other side of the FET 402 is connected to the output of a second inverter 403, and the input of the second inverter 403 and the output of the first inverter 401 are connected together at an output node 404.

Returning to FIG. 3, a first data signal D1 and a second data signal D2 are selectively supplied to the input of L1 and L2 via first and second input control FETs 304 and 305. Conduction of D1 is controlled by a clock signal CK, while conduction of D2 is controlled by not-CK (not-CK is generated from CK by way of an inverter 306). L1 is clocked by not-CK and L2 is clocked by CK.

Selection means 307 in the form of an AND gate 308 and first and second selection FETs 309 and 310 control the way in which the outputs L1 and L2 are supplied to the input of L3. The AND gate 308 accepts not-CK and the contents of a memory element 311 as inputs, and the output of the AND gate 308 controls conduction of the first selection FET 309. The first selection FET 309 accepts output of L1 and, when conducting, feeds the signal to the input of L3. CK controls conduction of the second selection FET 310, such that, when conducting, FET 310 feeds the output of L2 to the input of L3. The output node of the third latch 303 is the output of the memory block.

Memory element 313 and not-CK are supplied as inputs to an AND gate 500, the output of which forms an input IN1 to MUX 312. Memory element 314 and CK are supplied as inputs to an AND gate 504, the output of which forms an input IN2 to the MUX 312. The MUX 312 includes select lines that are connected to CK and not-CK respectively. The contents of memory elements 313 and 314 are used to control whether CK and not-CK are input to the MUX. If both memory elements contain zero values, the output of the MUX 312 is maintained as a high-impedance load. The output of MUX 312 is input to the clock port of the third latch 303.

Figure 5:
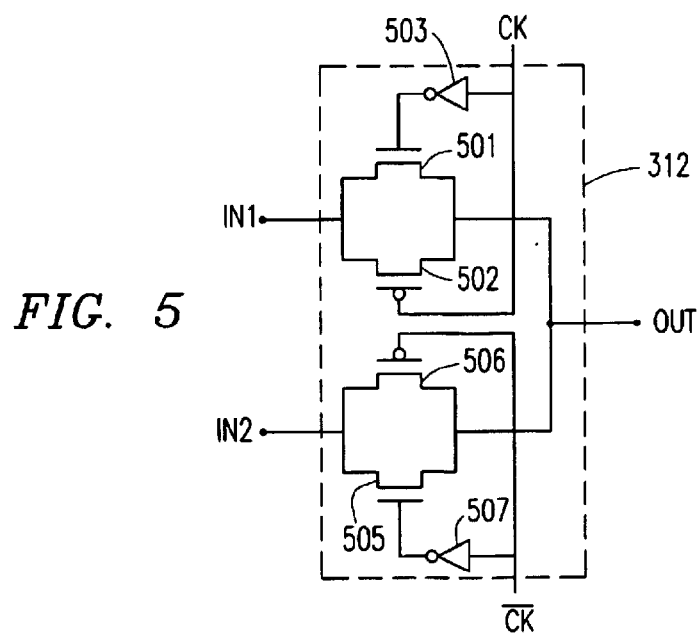
FIG. 5 shows an exemplary multiplexer for use in the memory block of FIG. 3.

An exemplary form of the MUX 312 is shown in FIG. 5. IN1 is connected to one side of a p-type FET 501 and an n-type FET 502. The other sides of FETs 501 and 502 are connected to together and to the output OUT of the MUX 312. Conduction of FET 502 is controlled by the value of CK, while conduction of FET 501 is controlled by a not-CK signal generated by an inverter 503.

The opposite half of the MUX 312 is effectively a mirror image of the portion so far described. IN2 is connected to one side of a p-type FET 505 and an n-type FET 506. The other sides of FETs 505 and 506 are connected together and to the output OUT of the MUX 312. Conduction of FET 506 is controlled by the value of not-CK, while conduction of FET 505 is controlled by an inverted version of not-CK (i.e., CK) by an inverter 507.

Other ways of implementing the MUX 312 will suggest themselves to those skilled in the art of microelectronic design.

The programmable I/O block is configurable to operate in a number of modes. In a first mode, the values of memory element elements 311, 313, 314 are high. This means that the AND gate 308 operates to pass not-CK to the gate of input selection FET 309. Components FET 304, L1, FET 309 and L3 are therefore configured to act as a falling-edge triggered flip flop, and components FET 305, L2, FET 310 and L3 are configured to act as a rising-edge triggered flip-flop.

To clock out the D1 and D2 data in a multiplexed fashion, it is necessary to clock the outputs of L1 and L2 into L3 with appropriate timing. This is done by way of MUX 312.

Referring to FIG. 5, the inputs IN1 and IN2 to MUX 12 are not-CK and CK respectively. When CK is low, IN1 is selected at the output of MUX 312 and when CK is high, IN2 is selected at the output of the MUX. The high value of memory element 313 causes the AND gate 500 to pass the value of IN1 to FETs 501 and 502, and also switches off FETs 505 and 506. The low value of IN2 causes FETs 501 and 502 to be turned on, so the high value of IN1 is passed to OUT.

Conversely, when CK falls (and not-CK rises), FETs 501 and 502 will cease to conduct, while FETs 505 and 506 will commence conducting. The value of IN2 (i.e., CK) is then passed to OUT.

In summary, D2 is available at the output (Q) of L3 at the positive edge of CK, and D1 is available at the negative edge of CK.

In a second mode, the value of memory element 311 is zero. This has the effect of decoupling not-CK from FET 309, which means that the output of L1 is never provided to the input of L3. The value of memory element 313 is zero, which disables the output of AND gate 500, and the value of memory element 314 is high, which enables AND gate 504 such that OUT follows IN2 (i.e., CK). This ensures that D2 is clocked from L3 in synchronization with when it is available at the input to L3. In this way, L2 and L3 are effectively combined to form a positive-edge triggered register.

It will be appreciated by those skilled in the art, that other modes are available using the exemplary circuitry. For example, by setting the values of memory elements 313 and 314 low and that of memory element 311 high, the entire arrangement becomes a dual-edge flip-flop. At a positive edge of CK, L2 is active and outputs to Q, while at the negative edge of CK, L1 is active and outputs to Q.

It will be appreciated that the MUX 312 can be replaced with other circuitry, depending upon the level of programmability required. For example, of modes 1 and 2 are all that is required, an OR gate can be used, taking CK and the value of a programmable memory element as inputs. When the value of the memory element is high, the output of the OR gate is high, which means FET 402 in L3 is always on. The output of L3 therefore simply follows the input to L3.

Figure 1:
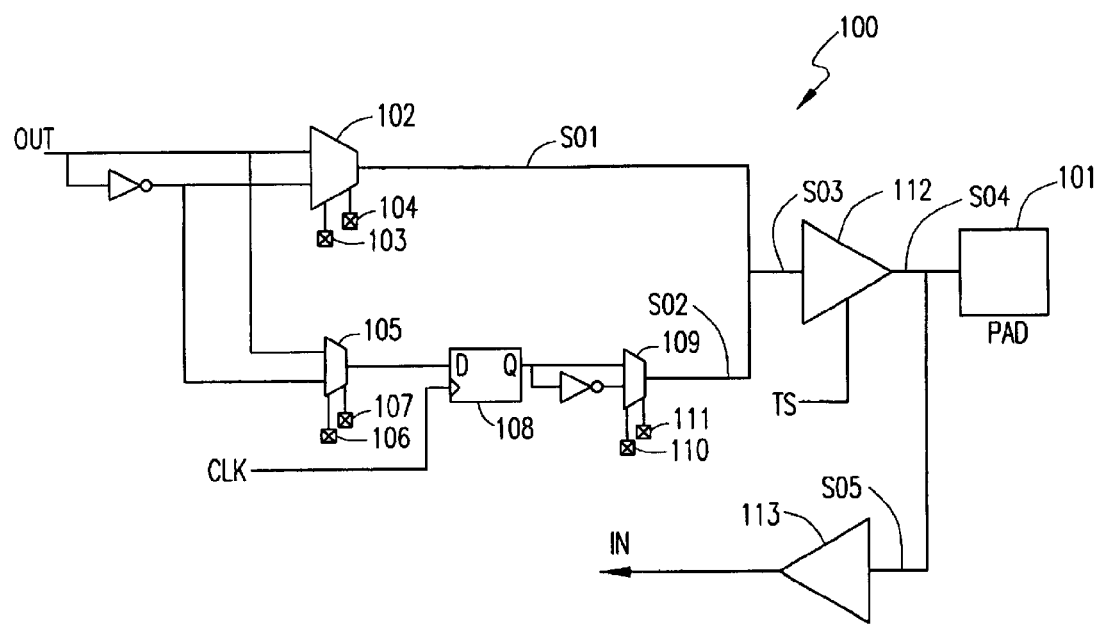
FIG. 1 is a schematic of a prior art input/output (I/O) integrated circuit.
Figure 2:
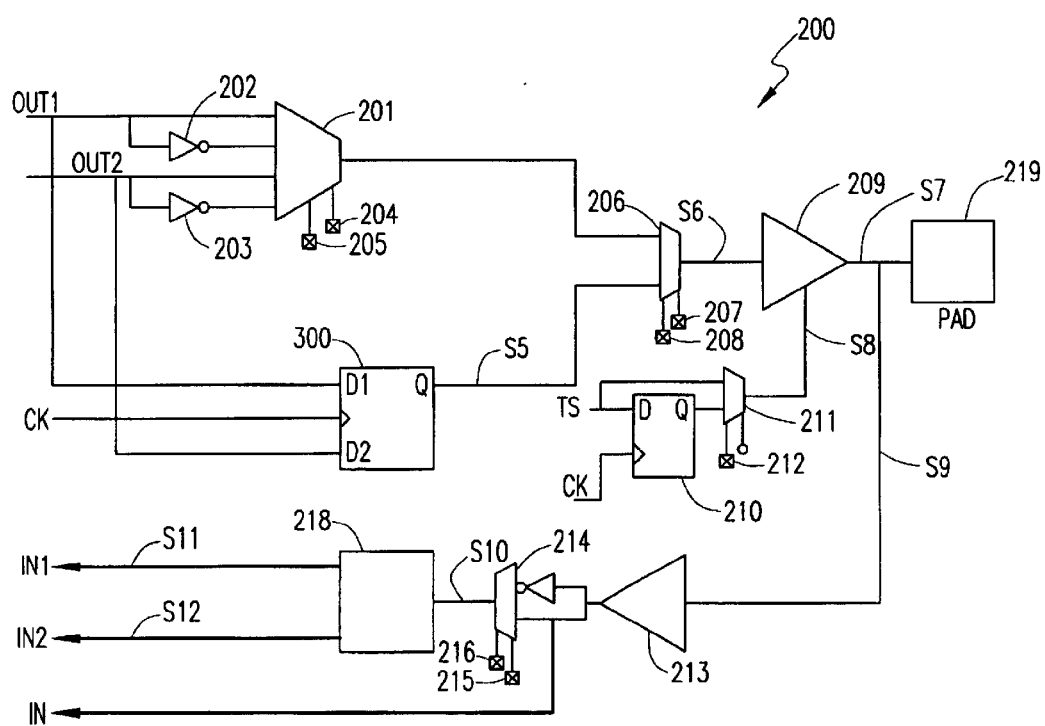
FIG. 2 shows a first embodiment of a programmable input/output (I/O) block in a field programmable gate array (FPGA) integrated circuit, incorporating a programmable memory element according to the invention.
Figure 2A:
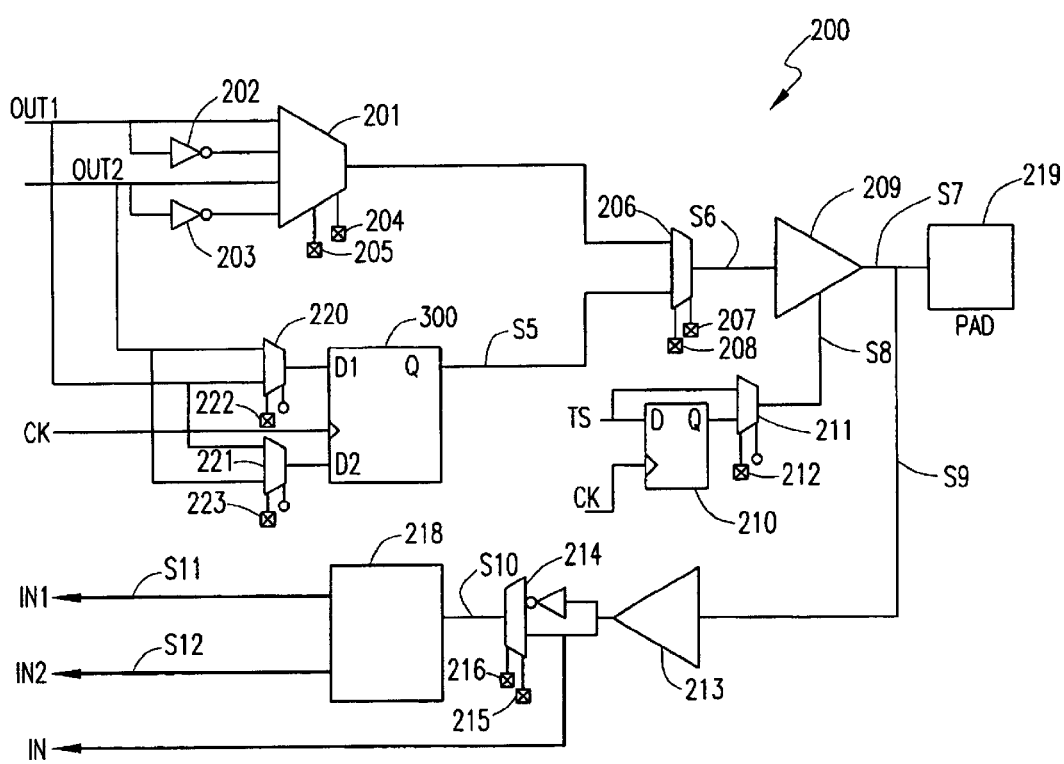
FIG. 2A shows an alternative embodiment of an I/O block incorporating a programmable memory element according to the invention.
Figure 2B:
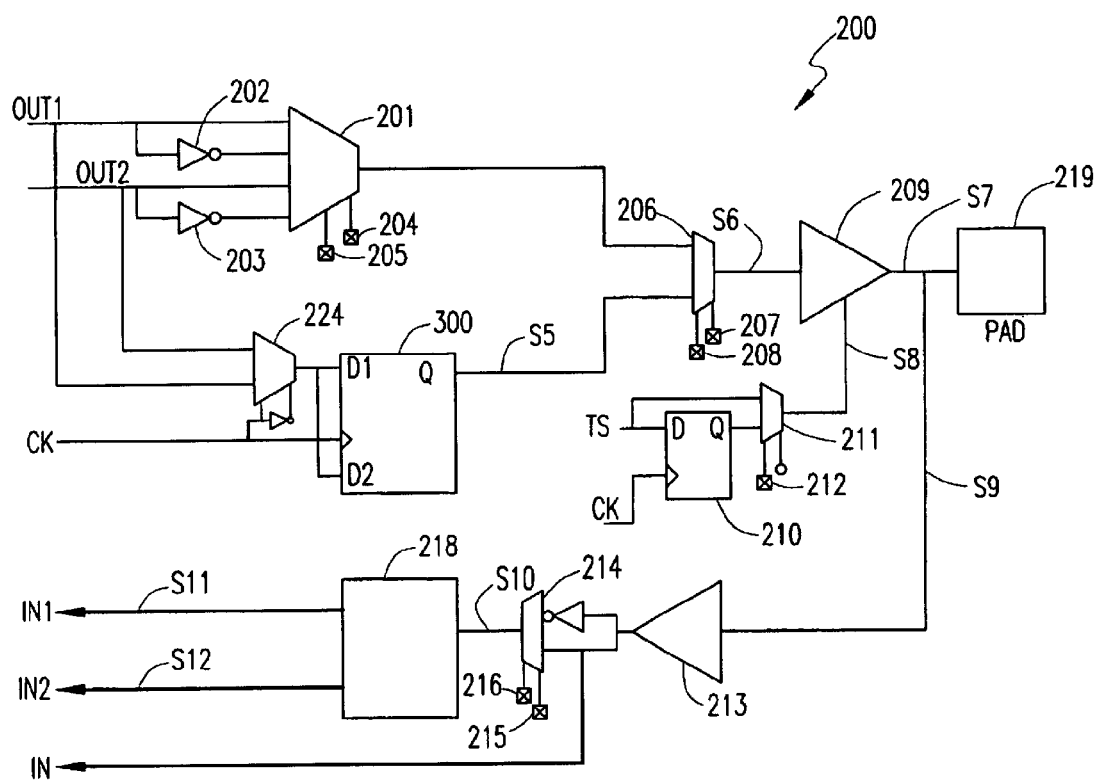
FIG. 2B shows another alternative embodiment of an I/O block incorporating a programmable memory element according to the invention.

Turning now to FIGS. 2 to 2B, there are shown a number of I/O block circuits that use the memory block described in relation to FIGS. 3 to 5. In the I/O block 200 of FIG. 2, the D1 and D2 inputs to programmable memory block 300 are connected to OUT1 and OUT2 respectively. OUT1 and OUT2 are supplied from the core (not shown). A MUX 201 accepts OUT1 and OUT2 as inputs, as well as not-OUT1 and not-OUT2 generated by inverters 202 and 203 respectively. The output of MUX 210 is controllable by way of the values contained in memory elements 204 and 205.

A MUX 206 accepts as inputs the output of MUX 201 and the output of the memory block. The output of MUX 206 is selectable by way of the values of memory elements 207 and 208, and is provided to the input of a tristate buffer 209. The state of buffer 209 is controlled by a signal TS by way of a D-type latch 210 and a MUX 211 controlled by the value of memory element 212. The function of the MUX 211 and D-type latch 210 is to ensure the state of buffer 209 changes at appropriate times only. The output of the tristate buffer 209 is supplied to the PAD 219.

The I/O block 200 also includes input circuitry in the form of an input buffer 213 and a MUX 214 controlled by the values in memory elements 215 and 216. The inputs to the MUX 214 are the output of the buffer 213 and an inverted version generated by inverter 217. A demultiplexer 218 accepts the output of the MUX 214 and demultiplexes it into IN1 and IN2 data signals. An unmultiplexed version IN of the incoming data signal is also available directly from the output of the input buffer 19.

When the circuitry is in output mode, any one of OUT1, OUT2, not-OUT1 and not-OUT2 can be made transparently available to the PAD 212 by way of MUX 201, MUX 206 and tristate buffer 209, as controlled by the values of memory elements 204 and 205. Alternatively, MUX 206 can be controlled to pass the output of memory block 300 to the PAD 212 via the tristate buffer 209. In this case, the data received by the PAD 212 depends upon the mode selected for the memory block 300, as described in relation to FIGS. 3 to 5. The output of MUX 206 ensures that the presently selected value, whether from MUX 201 or memory block 300, is only made available to the PAD 219 at an appropriate time with regard to the clock CK, and only when the PAD 219 is not being used to input data. In the latter case, the buffer 209 is controlled to appear as a high impedance load to the PAD 219, and the data from PAD 209 is input via buffer 213.

FIG. 2A is similar to the arrangement of FIG. 2, and like numbers designate like features. The difference is the addition of multiplexers 220 and 221, the inputs of which are OUT1 and OUT2 and the outputs of which are controlled by the values of memory elements 222 and 223 respectively. It will be apparent to those skilled in the art that the arrangement of the multiplexers 220 and 221 offers the ability to selectively swap the inputs to D1 and D2 between OUT1 and OUT2.

The embodiment in FIG. 2A offers the option of deliver OUT1 and OUT2 at the respective inputs D1 and D2 either way around. The order in which OUT1 and OUT2 are multiplexed out of output Q (i.e., whether the particular data value is available on the positive or negative edge of the clock) can be selected dependent upon the circumstances.

FIG. 2B is also similar to the arrangement of FIG. 2, and again, like numbers designate like features. The difference is that instead of a memory element, a multiplexer 224 is used to control which of OUT1 and OUT2 is supplied to both inputs of the memory block 300. The input selected by the multiplexer for output controlled by the value of the clock CK (and not-CK). This arrangement requires one fewer MUXs than that of FIG. 2A; only one MUX 224 and with the clock as its select line is required. The disadvantage compared to FIG. 2A is that the order in which OUT1 and OUT2 are made available to Q (i.e., the clock edge direction for each value is fixed. In this case, OUT1 is available at the positive edge of clock CK, while OUT2 is available at the negative edge.

Although preferred embodiments of the method and apparatus of the present invention have been illustrated in the accompanying Drawings and described in the foregoing Detailed Description, it will be understood that the invention is not limited to the embodiments disclosed, but is capable of numerous rearrangements, modifications and substitutions without departing from the spirit of the invention as set forth and defined by the following claims.

What is claimed is:

1. A programmable flip-flop for outputting data, the flip-flop including:
    a first latch for latching a first input value in response to a rising edge of a clock signal;
    a second latch for latching a second input value in response to a falling edge of the clock signal;
    selection means controlled by the clock signal for selectively supplying outputs of the first and second latches to the input of a third latch;
    third latch control means accepting as inputs the clock signal and an inverted clock signal;
    the programmable flip-flop being configurable to operate in at least first and second modes selectable by the selection means and third latch control means, such that in the first mode the output of the third latch is the first and second input values multiplexed together and output at twice the clock rate, and in the second mode one of the first and second latches is disconnected from the third latch such that the programmable flip-flop operates as a single edge-triggered register clocking out one of the first and second input values from the third latch.

2. The programmable flip-flop according to claim 1, wherein the selection means includes a first switch connecting the output of the second latch to the input of the third latch, the first switch being controlled by the clock signal such that when the clock signal is high, the first switch is closed, thereby connecting the second latch to the third latch, and when the clock signal is low, the first switch is open, thereby disconnecting the third latch from the second latch.

3. The programmable flip-flop according to claim 1, wherein the selection means includes a second switch connecting the output of the first latch to the input of the third latch, the switch being controlled by logic circuitry that accepts the clock signal and at least one programmable memory element as inputs, such that:
    in the first mode, the programmable memory element is asserted, causing the clock signal to control the second switch such that when the clock signal is low, the switch is closed, thereby connecting the first latch to the third latch, and when the clock signal is high, the switch is open, thereby disconnecting the third latch from the second latch; and
    in the second mode, the programmable memory element is not asserted, causing the second switch to isolate the first latch from the third latch.

4. The programmable flip-flop according to claim 1, wherein the third latch control means is a selection block for selectively supplying the inverted or non-inverted clock signal to a clock input of the third latch.

5. An input/output block, having a programmable flip-flop comprising:
    a first latch for latching a first input value in response to a rising edge of a clock signal;
    a second latch for latching a second input value in response to a falling edge of the clock signal;
    selection means controlled by the clock signal for selectively supplying outputs of the first and second latches to the input of a third latch;
    third latch control means accepting as inputs the clock signal and an inverted clock signal;
    the programmable flip-flop being configurable to operate in at least first and second modes selectable by the selection means and third latch control means, such that in the first mode the output of the third latch is the first and second input values multiplexed together and output at twice the clock rate, and in the second mode one of the first and second latches is disconnected from the third latch such that the programmable flip-flop operates as a single edge-triggered register clocking out one of the first and second input values from the third latch; and
    further including first input selection means and second input selection means, the first and second input selection means being selectable such that a first data value supplied to the first input selection means can be output as the first input value or the second input value, and a second data value supplied to the second input selection means can be output as the first input value of the second input value.

6. The input/output block according to claim 5, wherein operation of the first and second input selection blocks is controlled by the values of one or more configuration memory elements.

7. The input/output block according to claim 5, further including an output buffer for buffering the output of the third latch and supplying it to an interface pad.

8. The input/output block according to claim 7, wherein the buffer is a tristate buffer.

9. The input/output block according to claim 7, further including an input section, the programmable interface block including at least a third mode, in which data is accepted as input via the interface pad.

10. The input/output block according to claim 5, wherein the input values are from a functional block on the same chip as the interface block.

11. The input/output block according to claim 10, wherein the functional block comprises field programmable logic.

12. A field programmable gate array circuit incorporating an input/output block comprising:
 a programmable flip-flop which comprises:
 a first latch for latching a first input value in response to a rising edge of a clock signal;
 a second latch for latching a second input value in response to a falling edge of the clock signal;
 selection means controlled by the clock signal for selectively supplying outputs of the first and second latches to the input of a third latch;
 third latch control means accepting as inputs the clock signal and an inverted clock signal;
 the programmable flip-flop being configurable to operate in at least first and second modes selectable by the selection means and third latch control means, such that in the first mode the output of the third latch is the first and second input values multiplexed together and output at twice the clock rate, and in the second mode one of the first and second latches is disconnected from the third latch such that the programmable flip-flop operates as a single edge-triggered register clocking out one of the first and second input values from the third latch.

13. The gate array circuit of claim 12 further including first input selection means and second input selection means, the first and second input selection means being selectable such that a first data value supplied to the first input selection means can be output as the first input value or the second input value, and a second data value supplied to the second input selection means can be output as the first input value of the second input value.

14. A data output circuit, comprising:
 a first input for receiving a first input value;
 a second input for receiving a second input value;
 a control input for receiving a mode selection value;
 a data output;
 a clocked data latching circuit connected to the first, second, third and control inputs and the data output, the data latching circuit operable responsive to a first mode selection value in a first mode to generate at the data output the first and second input values multiplexed together at twice a clock rate, and further operable responsive to a second mode selection value in a second mode to generate at the data output one of the first and second input values at the clock rate.

15. The circuit of claim 14 wherein the clocked data latching circuit comprises:

a first latch for latching the first input value in response to a first edge of a clock signal;
 a second latch for latching the second input value in response to a second edge of the clock signal;
 a third latch having an output connected to the data output;
 a selection circuit that selectively supplies outputs of the first and second latches to an input of the third latch in accordance with the mode selection value and the clock signal.

16. The circuit of claim 15 further comprising a third latch clock control circuit that selectively supplies a clock and inverted clock to a clock input of the third latch in accordance with the mode selection value.

17. The circuit of claim 15 wherein the selection circuit comprises:
 a first switch selectively connecting the first latch output to the third latch input; and
 a second switch selectively connecting the second latch output to the third latch input.

18. The circuit of claim 17 wherein the first switch is controlled by the clock signal such that when the clock signal is first state, the first switch is closed to connect the second latch to the third latch, and when the clock signal is in a second state, the first switch is open to disconnect the third latch from the second latch.

19. The circuit of claim 17 wherein the second switch is controlled by a logic circuit responsive to the clock signal and the mode selection value such that:
 in the first mode, the second switch is closed when the clock signal is in the second state to connect the first latch to the third latch, and the second switch is open when the clock signal is in the first state to disconnect the third latch from the second latch; and
 in the second mode, the second switch disconnects the first latch from the third latch.

20. The circuit of claim 14 wherein the mode selection value is a multi-bit value.

21. The circuit of claim 14 wherein the data output circuit is part of an input/output circuit connected to a pad.

22. The circuit of claim 14 wherein the data output circuit is implemented as an integrated circuit.

23. The circuit of claim 22 wherein the integrated circuit is a field programmable gate array.

24. The circuit of claim 14 further including:
 a first multiplexer having a plurality of data inputs and an output;
 a second multiplexer having a first input coupled to the first multiplexer output and a second input coupled to the data output, the second multiplexer further having an output; and
 a buffer having an input coupled to the second multiplexer output and an output coupled to an integrated circuit pad.

25. The circuit of claim 24 wherein the pad is an input/output pad.

26. The circuit of claim 24 wherein the plurality of data inputs to the first multiplexer include a first data input receiving the first input value and a second data input receiving the second input value.

27. The circuit of claim 24 wherein the buffer is a tristate buffer and the circuit further comprises a tristate operation control circuit connected to the tristate buffer.

* * * * *